(12) United States Patent
Frederick et al.

(10) Patent No.: US 11,240,941 B2
(45) Date of Patent: Feb. 1, 2022

(54) AUTONOMOUS VEHICLE LIDAR COOLING SYSTEM

(71) Applicant: TOYOTA MOTOR ENGINEERING & MANUFACTURING NORTH AMERICA, INC., Plano, TX (US)

(72) Inventors: Scott L. Frederick, Brighton, MI (US); Bill Castleman, Canton, MI (US); Jeff A. Teeples, Dexter, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/129,374

(22) Filed: Sep. 12, 2018

(65) Prior Publication Data

US 2020/0084920 A1 Mar. 12, 2020

(51) Int. Cl.
*G01S 13/00* (2006.01)
*H05K 7/20* (2006.01)
*G05D 1/00* (2006.01)
*G01S 13/86* (2006.01)
*G01S 7/481* (2006.01)

(52) U.S. Cl.
CPC ........ *H05K 7/20863* (2013.01); *G01S 7/4811* (2013.01); *G01S 13/865* (2013.01); *G05D 1/0088* (2013.01); *H05K 7/20145* (2013.01); *H05K 7/20172* (2013.01)

(58) Field of Classification Search
CPC ................................................. H05K 7/20863
See application file for complete search history.

(56) References Cited

U.S. PATENT DOCUMENTS

| 4,757,200 A | * | 7/1988 | Shepherd | G01S 17/89 250/332 |
| 6,230,677 B1 | * | 5/2001 | Setsuda | B60R 16/04 123/184.21 |
| 6,282,911 B1 | | 9/2001 | Watanabe et al. | |
| 6,470,739 B1 | * | 10/2002 | Matsumura | G01L 19/0007 73/114.37 |
| 7,884,937 B2 | * | 2/2011 | Prasad | G01N 21/3518 356/437 |

(Continued)

FOREIGN PATENT DOCUMENTS

| DE | 10 2012 110 584 A1 | 6/2014 |
| DE | 10 2016 201 057 A1 | 7/2017 |
| JP | 2009-222504 A | 10/2009 |

*Primary Examiner* — Filip Zec
(74) *Attorney, Agent, or Firm* — Oblon, McClelland, Maier & Neustadt, L.L.P.

(57) ABSTRACT

Autonomous vehicles are made by fitting sensors to non-autonomous vehicle platforms. A mounting structure to mount sensors to the vehicle is needed to provide sensor data about the environment of the vehicle. The mounting structure is sealed to prevent exterior environmental elements from harming the sensor hardware. Therefore, any heat generated from the sensors or equipment and/or exterior heat is sealed and trapped in the mounting structure. Thus, a way to cool the sensors is needed and to limit additions to the mounting structure is optimized by tapping into existing vehicle cooling systems to cool the sensors. Additionally, removal of the heated air by exhausting the air out from the mounting structure to aid in the cooling of the sensors is necessary.

21 Claims, 6 Drawing Sheets

(56) References Cited

U.S. PATENT DOCUMENTS

| | | | |
|---|---|---|---|
| 8,455,133 B2* | 6/2013 | Anantharaman | H01M 10/643 429/149 |
| 8,616,623 B2* | 12/2013 | Sawada | B60J 7/043 296/224 |
| 9,796,280 B2* | 10/2017 | McCool | B60L 53/12 |
| 9,855,816 B2 | 1/2018 | Meyhofer et al. | |
| 10,099,630 B1* | 10/2018 | Krishnan | B60Q 1/0023 |
| 10,160,286 B2* | 12/2018 | Mori | B60H 1/143 |
| 10,429,495 B1* | 10/2019 | Wang | G01S 7/4815 |
| 10,665,140 B1* | 5/2020 | Ahn | G06Q 30/0265 |
| 2006/0254372 A1* | 11/2006 | Scott | G01N 17/002 73/865.6 |
| 2012/0203410 A1* | 8/2012 | Wechlin | B60L 53/38 701/22 |
| 2013/0273824 A1 | 10/2013 | Lang et al. | |
| 2016/0041452 A1 | 2/2016 | Nomura et al. | |
| 2016/0236725 A1* | 8/2016 | Shirai | B62D 35/00 |
| 2017/0075888 A1 | 3/2017 | Ekin | |
| 2017/0282675 A1 | 10/2017 | Meyhofer et al. | |
| 2017/0305360 A1* | 10/2017 | Zajac | G01C 3/08 |
| 2017/0369106 A1* | 12/2017 | Williams | G01S 7/4813 |
| 2018/0015886 A1* | 1/2018 | Frank | B60R 13/06 |

\* cited by examiner

AUTONOMOUS VEHICLE LIDAR COOLING SYSTEM

BACKGROUND

Technical Field

The present disclosure relates to a cooling system for sensors on a vehicle having an automated driving system.

Related Art

In autonomous vehicles, sensors are necessary to determine the environment within which the vehicle is operating. Autonomous vehicle sensors require cooling to prevent damage due to over-heating conditions. The sensors are often mounted in sealed encasements which prevent the flow of air and limit external effects from the environment; however such sealed conditions may exacerbate heat issues in the mounted sensors.

SUMMARY

Since heat is introduce into the mounted sensors either due to environmental situations (e.g., hot weather conditions) or the operations of the sensors themselves, a cooling system to force better environmental conditions is necessary. Accordingly, an ideal cooling system will force introduction of cool air as well as draw out heated air from the sensor mounting system. Additionally, a cooling system may ideally be tied directly to the cooling system of the vehicle itself to limit further addition of parts which may fail or heat which may be introduced.

Therefore, it is an object of the present disclosure to provide a cooling system for sensors on a vehicle having an automated driving system.

In order to achieve the above-described object, the cooling system for sensors on a vehicle having an automated driving system according to a first aspect of the present invention is a sensor mounting systems retrofitted to a production line vehicle and using the existing HVAC system of the vehicle to cool the sensors in the sensor mount. The sensors mounted in the system may include light detection and ranging sensor (lidar) and radio detection and ranging sensor (radar) sensor s which generate more heat while under operation.

BRIEF DESCRIPTION OF THE DRAWINGS

Exemplary embodiments of the present disclosure will be described in detail based on the following figures, wherein.

DETAILED DESCRIPTION

Figure 1A:
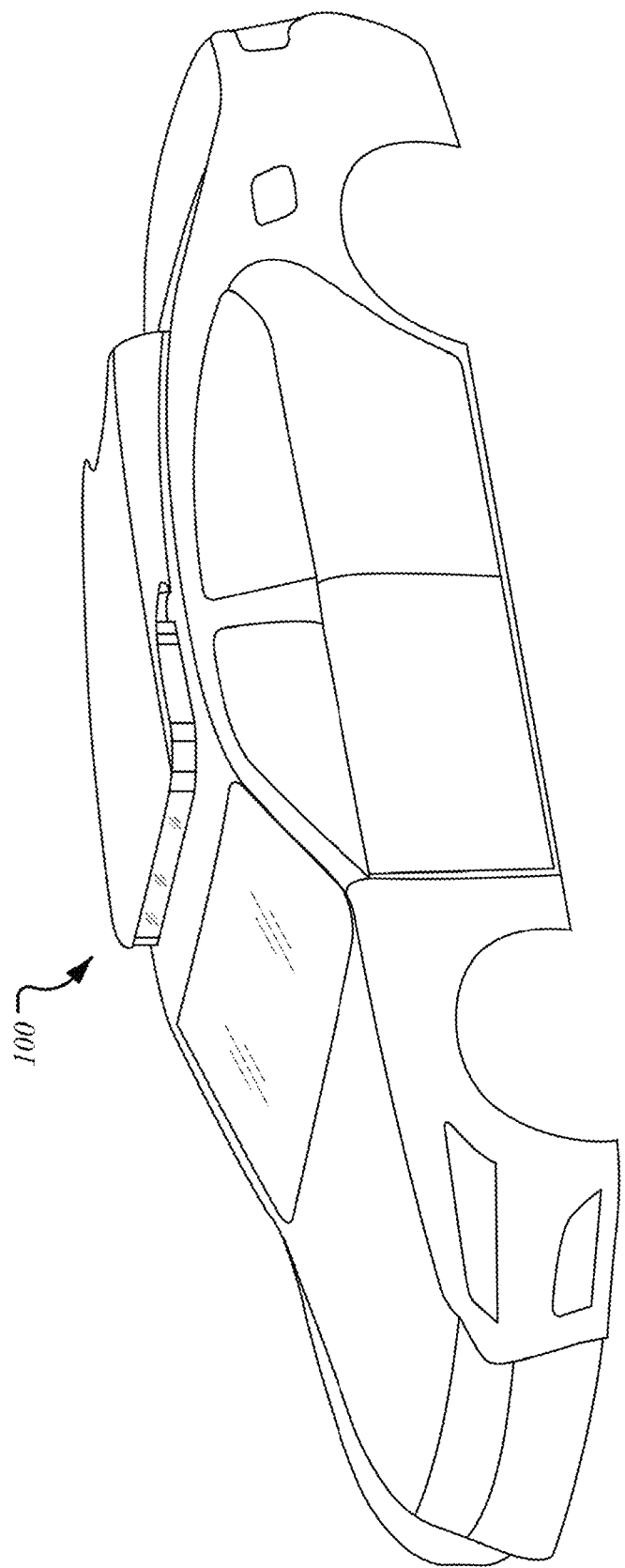
FIG. 1A is a perspective view showing a cover over the sensor mounting system with a cover on the vehicle, according to a first exemplary embodiment.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "front," "side," "height," "width," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

Hereinafter, exemplary embodiments of the present disclosure will be described in detail based on the drawings. Unless specifically stated otherwise, if simple up-down, front-rear, or left-right directions are used in the following description, then these refer respectively to the up-down direction of the vehicle body, the front-rear direction of the vehicle body, and the left-right direction of the vehicle body (i.e., the vehicle transverse direction).

In a first embodiment, a sensor mounting system 100 is mounted to a vehicle is described. As is shown in FIG. 1A, a perspective view showing a cover over the sensor mounting system with a cover on the vehicle, according to a first exemplary embodiment. Although, in the first exemplary embodiment, the vehicle is a sedan type vehicle platform, vehicles for attaching the mounting structure may include any transportation method which could be converted to autonomous vehicles. The transportation methods may include any automobiles, vans, buses, trucks, sport utility vehicles, motorcycles, etc. Further, in other exemplary embodiments, the sensor mounting system 100 cover is shaped differently based on the number of sensors, sensor shapes/sizes, directionality of the sensors, and vehicle type and mounting location. Further, the cover may be made of different materials to protect the sensor mounting system 100 from different environmental elements. For example, the side and front facing portions may be made from thicker and light or shiny colored materials to disperse heat and clear materials for sensors to collect information through. Additionally, the cover may include portions made from a membrane material that is hydrophobic to the exterior environment but is hydrophilic or permeable by water and air from the sensor mounting system interior. The cover may be attached to the rooftop of the vehicle or other portions of the sensor mounting system 100.

Figure 1B:
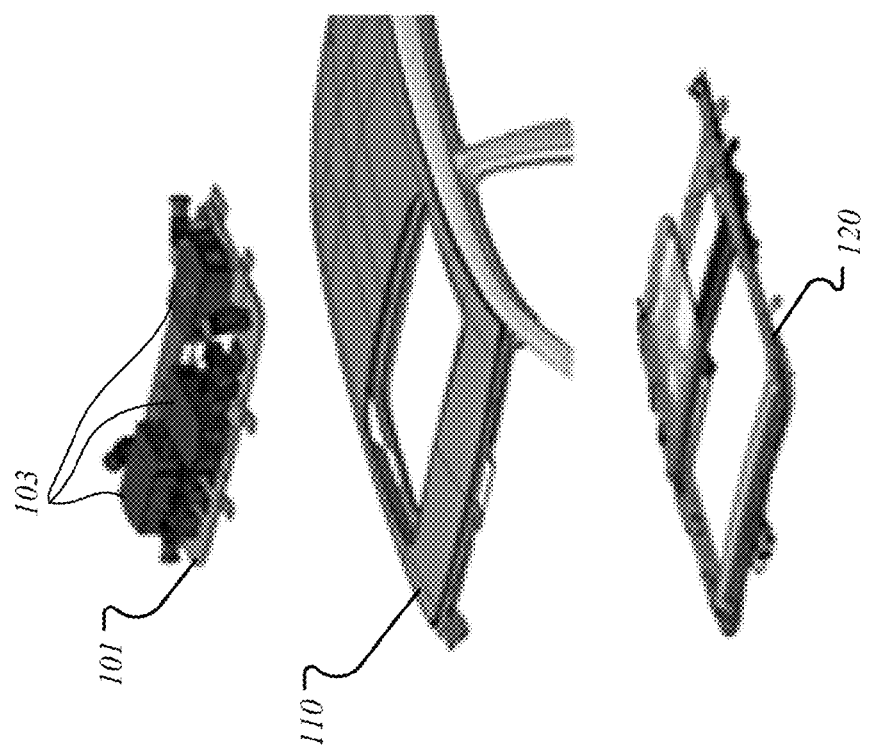
FIG. 1B is a perspective view showing an exploded version of the sensor mounting system with the sensors and vehicle chassis parts, according to the first exemplary embodiment.

As is shown in FIG. 1B, a perspective view showing an exploded version of part of a sensor mounting system with sensors and vehicle chassis parts, according to the first exemplary embodiment. In the first exemplary embodiment the sensor mounting base 101 and sensors 103 are mounted to the rooftop 110 of the vehicle. The sensors 103 are mounted to the sensor mounting base 101 to easily remove the entire sensor mounting system 100 from the vehicle for repair or updates. The sensors 103 may include large sensors such as lidar and radar sensors, and small sensors including cameras, thermometers, and barometers. However, in the first exemplary embodiment, the large sensors 103 seen in FIG. 1B generate greater amounts of heat which have a greater effect on the interior operating environment of the sensor mounting system 100. The rooftop 110 has reinforcing vehicle chassis structures 120 which reinforce the roof of the vehicle. Not shown is the cover seen in FIG. 1A which protects the sensor mounting system 100 and the sensors 103 from the environment elements (e.g., water, dirt, dust, etc.).

The sensor mounting base 101 may be attached to the rooftop 110 and/or the reinforcing vehicle chassis structures 120. In the first exemplary embodiment, the sensor mounting base 101 is attached to the reinforcing vehicle chassis structure 120 in the sunroof of the vehicle. Further, the sunroof opening may provide further access to the sensor mounting base 101 from the interior of the vehicle.

Figure 2:
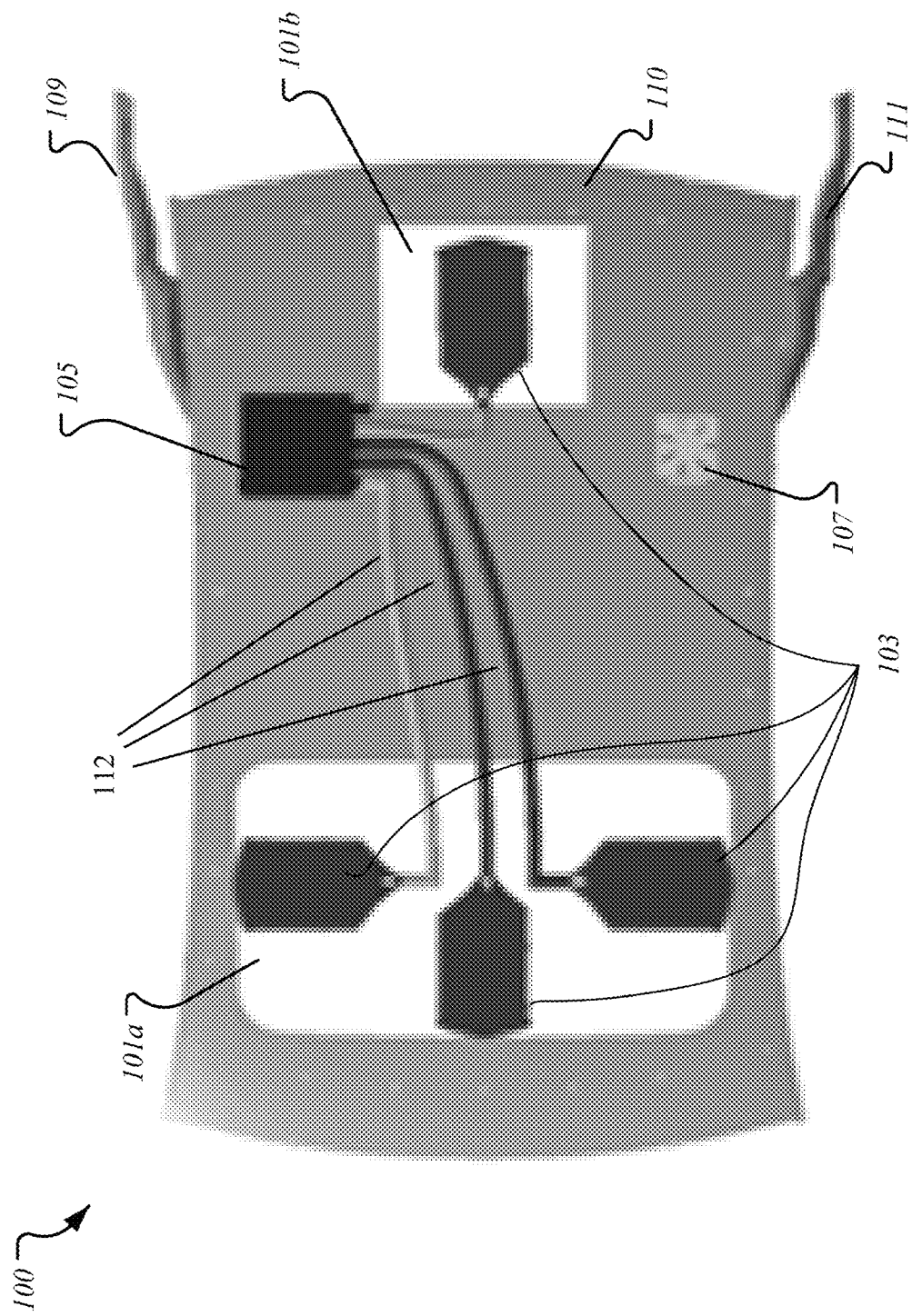
FIG. 2 is a top view showing the cooling system with the sensors mounted, according to the first exemplary embodiment.

As shown in FIG. 2, a top view showing the cooling system with the sensors mounted, according to a first exemplary embodiment. Specifically, FIG. 2 shows a top view of the sensor mounting system 100 that includes the sensor mounting base 101, four lidar sensors 103, a manifold 105, exhaust port/fan 107, cool air duct 109, and exhaust duct 111. The lidar sensor 103, facing the rear of the vehicle, may be mounted to a separate or same sensor mounting base 101 which is then attached to the roof or reinforcing vehicle chassis structures 120 of the roof of the vehicle. In other exemplary embodiments, the lidar sensor 103, facing the rear of the vehicle, may also be directly mounted to the roof or reinforcing vehicle chassis structures 120 of the roof of the vehicle. The cover of the sensor mounting system 100, which is shown in FIG. 1A, seals the sensor mounting system 100 from the environment. In other exemplary embodiments, the roof 110 and sensor mounting bases 101a and 101b may be replaced with one sensor mounting base 101 which is then attached to the roof 110 of the vehicle.

The manifold 105 is attached the roof 110, reinforcing vehicle chassis structures 120 of the roof of the vehicle, or same or different sensor mounting base 101. Further, the manifold 105 is attached to the cool air duct 109 through the roof 110 and is further provided with hoses 112 channeling cool air directly to each sensor 103. The manifold 105 include fans to force air through the hoses to the sensors 103. The other end of the cool air duct 109, not connected to the manifold 105, is attached to the HVAC of the vehicle to provide cool air to the manifold 105. The cool air duct 109 connects to a rear auxiliary HVAC duct/unit(s) of the vehicle, however, in other exemplary embodiments may be connected to other parts of the HVAC unit(s) of the vehicle that may be better suited based on the location of the manifold 105. The rear auxiliary HVAC duct/unit(s) may be separately controlled from a console in the rear interior of the vehicle. The sensor mounting system 100 with cooling uses the existing HVAC unit(s) of the vehicle to more easily retrofit the sensor mounting system 100 to production line vehicles. In other exemplary embodiments, the sensor mounting system 100 may have its own air conditioning unit that would require further modification to the vehicle.

The exhaust port/fan 107 extracts trapped heated hair from within the sensor mounting system 100 directing the heated air out of the sensor mounting system 100 to the exhaust duct 111. The exhaust duct 111 provides an exit for the heated air to an un-cooled body cavity of the vehicle or the exterior of the vehicle directly. In some embodiments, the exhaust duct 111 vents the heated air to the trunk of the vehicle. In other embodiments, the exhaust duct Ill vents the heated air to air gaps between the exterior body panels and interior panels and insulated portions of the vehicle. The air gaps may then exhaust the heated air from the vehicle through openings which are exposed to the outer environment of the vehicle.

Figure 3:
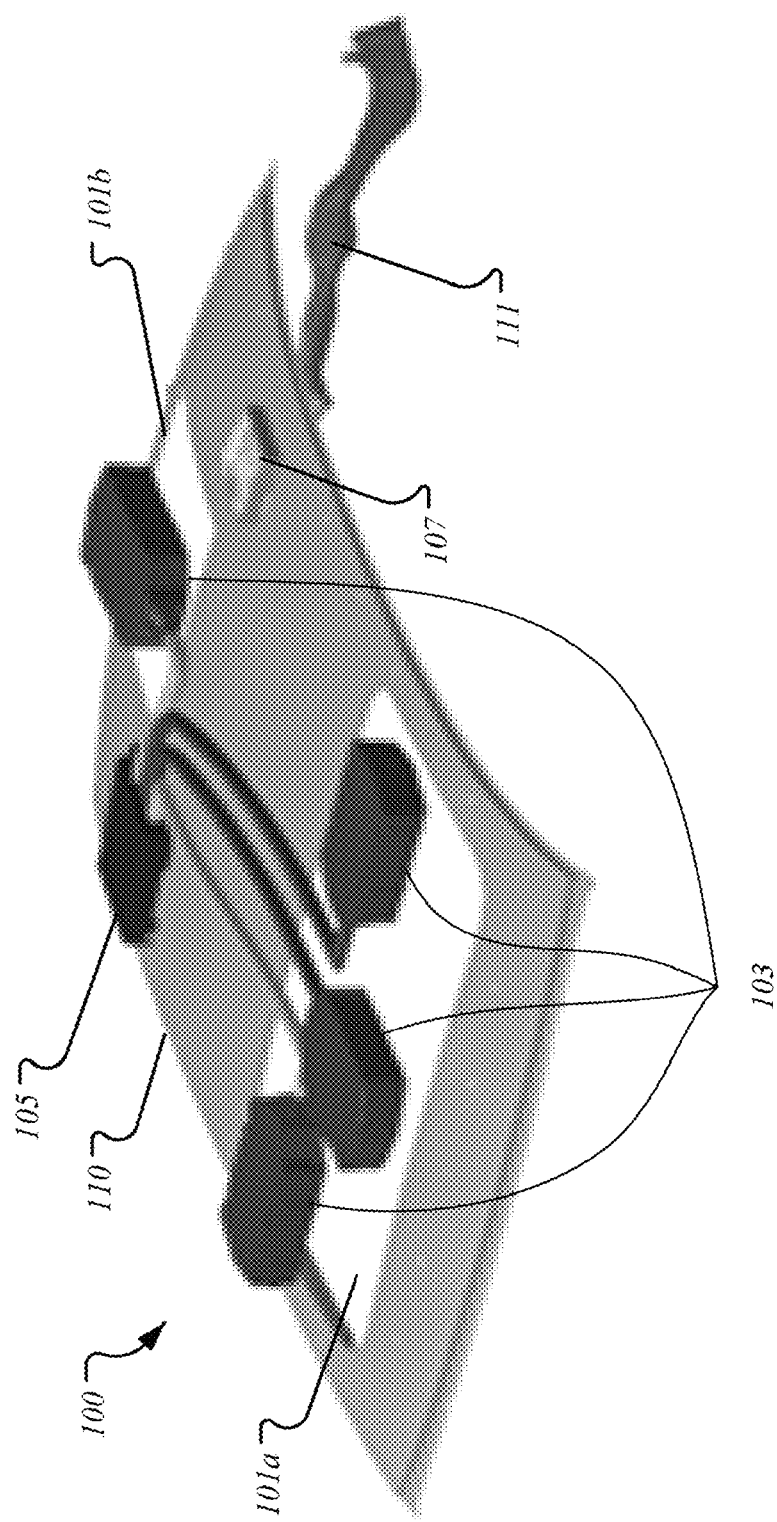
FIG. 3 is a perspective view showing the cooling system with the sensors mounted, according to the first exemplary embodiment.
Figure 4:
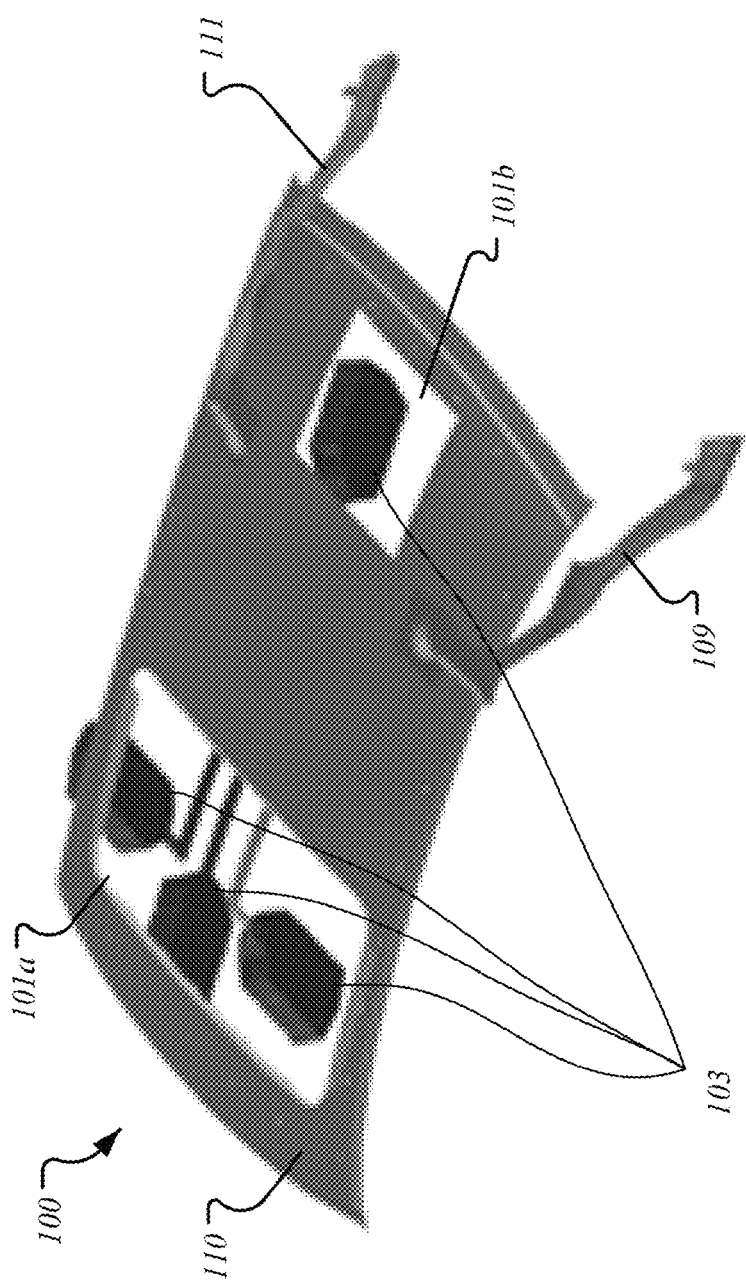
FIG. 4 is a perspective bottom view showing the cooling system with the sensors mounted, according to the first exemplary embodiment.

As shown in FIG. 3, a perspective view showing the sensor mounting system with the sensors mounted, according to the first exemplary embodiment. As seen, the set of three front-facing and side-facing lidar sensors 103 are mounted above the sunroof and the rear-facing is mounted to a rear mounting system base 101 with a cut out portion of the roof of the vehicle. Additionally, the manifold 105 and exhaust port/fan 107 are mounted directly to the roof panel near the rear of the vehicle, in order to connect to an auxiliary HVAC duct/unit(s) and the trunk respectively via the cool air duct 109 and exhaust duct 111. Additionally, the perspective bottom view (FIG. 4) of showing the mounting sensor system with the sensors mounted, according to the first exemplary embodiment, is shown. However, FIG. 4 shows the sunroof mounted mounting sensor base 101 and the rear-facing mounting sensor base 101 transparently. Further, FIG. 4 shows the connection between the cool air duct 109 through the vehicle roof 110 to the manifold 105. Additionally shown is the connection between the exhaust duct 111 through the vehicle roof 110 to the exhaust port/fan 107. In other exemplary embodiments, the roof 110 and sensor mounting bases 101a and 101b are replaced with a sensor mounting base 101 which is then attached to the roof 110 of the vehicle. The cool air duct 109 and exhaust duct 111 then run through the sensor mounting base 101 or both the sensor mounting base 101 and roof 110 to attach to the manifold 105 and exhaust port/fan 107.

Figure 5:
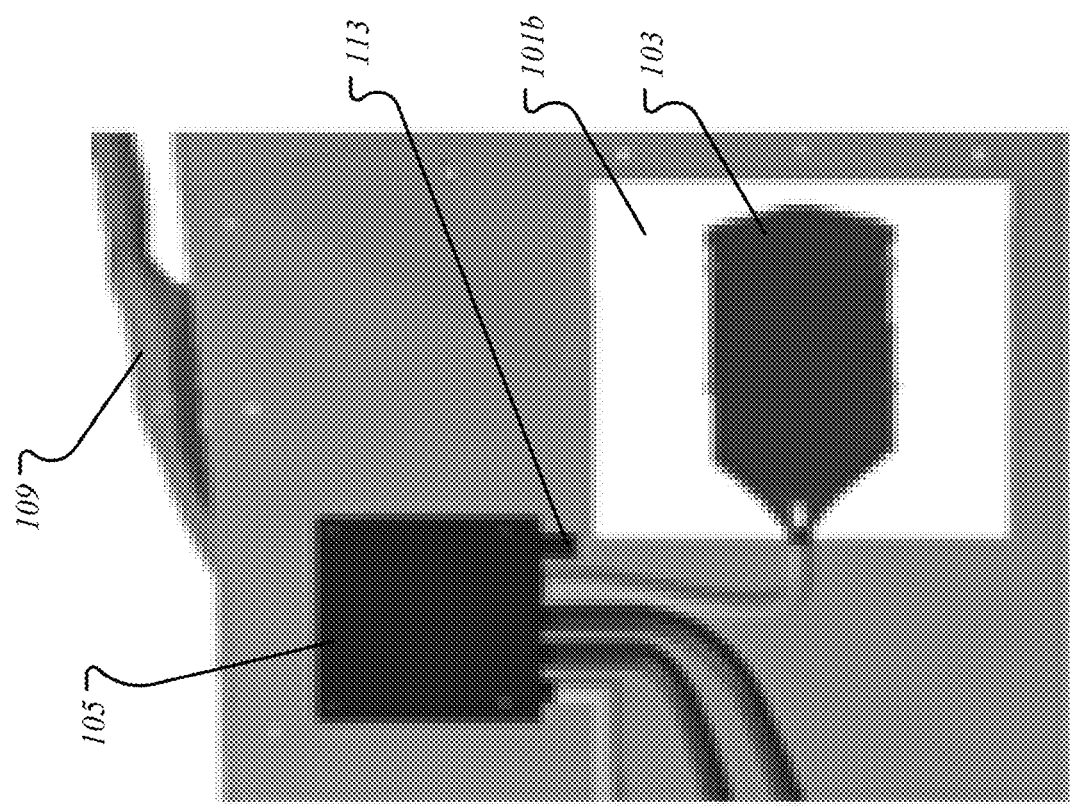
FIG. 5 is a top view showing a portion of the cooling system including the manifold and a lidar sensor, according to the first exemplary embodiment.

As shown in FIG. 5, a top view showing a portion of the cooling system including the manifold and a lidar sensor, according to the first exemplary embodiment. The manifold 105 is shown to have a cool air port 113 through which the cool air may exit the manifold 105 into the main cavity of the sensor mounting system 100.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other exemplary embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

What is claimed is:

1. A device comprising:
a base attachable to a roof of a vehicle;
a lidar sensor attached to the base;
a sensor cooling system; and
a cover attachable to the roof of the vehicle such that the cover and the base sandwich the lidar sensor therebetween when the cover is attached to the roof of the vehicle, wherein
the cover, the base, and the roof together form a cavity when the cover is attached to the roof of the vehicle,
the cavity is situated above the roof such that the roof and the cover sandwich a portion of the cavity,
the cavity houses the lidar sensor,
the cavity, including the portion of the cavity sandwiched by the roof and the cover, houses the sensor cooling system, and
the sensor cooling system includes:
an exhaust to remove hot air from the cavity, and
a manifold including a fan drawing cool air from an existing vehicle cooling system to the cavity.

2. The device according to 1, wherein the sensor cooling system includes a hose from the manifold to the lidar sensor.

3. The device according to claim 1, wherein the exhaust includes an exhaust fan for forced removal of the hot air.

4. The device according to claim 1, wherein the existing vehicle cooling system is an auxiliary vehicle cooling system of the vehicle.

5. The device according to claim 1, further comprising an exhaust duct to direct the hot air to a space within the vehicle.

6. The device according to claim 1, wherein the manifold includes a port releasing cool air to the cavity.

7. The device according to claim 6, wherein the cavity houses all sensors within the device.

8. A method of cooling a vehicle sensor system comprising:
providing a base attached to a roof of a vehicle; a lidar sensor attached to the base; a sensor cooling system; and a cover attached to the roof of the vehicle such that the cover and the base sandwich the lidar sensor therebetween, where the cover, the base, and the roof together form a cavity, the cavity is situated above the roof such that the roof and the cover sandwich a portion of the cavity; the cavity houses the lidar sensor, the cavity, including the portion of the cavity sandwiched by the roof and the cover, houses the sensor cooling system; and the sensor cooling system includes an exhaust and a manifold;
removing hot air from the cavity through the exhaust; and
drawing cool air from an existing vehicle cooling system through the fan to the cavity via the manifold.

9. The method of cooling the vehicle sensor system according to claim 8, wherein the sensor cooling system includes a hose from the manifold to the lidar sensor.

10. The method of cooling the vehicle sensor system according to claim 8, wherein the exhaust includes an exhaust fan for forced removal of the hot air.

11. The method of cooling the vehicle sensor system according to claim 8, wherein the existing vehicle cooling system is an auxiliary vehicle cooling system of the vehicle.

12. The method of cooling the vehicle sensor system according to claim 8, further comprising providing an exhaust duct to direct the hot air to a space within the vehicle.

13. The method of cooling the vehicle sensor system according to claim 8, wherein the manifold includes a port releasing cool air to the cavity.

14. The method of cooling the vehicle sensor system according to claim 13, wherein the cavity houses all sensors within the vehicle sensor system.

15. A vehicle, comprising:
an autonomous vehicle sensor mounting system, including:
one or more sensors; and
a bracket fit to a rooftop of the vehicle, the bracket including (i) a mount for the one or more sensors including at least one of a lidar and a radar, (ii) a sensor cooling system, and (iii) a cover covering the mount and the rooftop, wherein
the cover, the mount, and the roof together form a cavity,
the cavity is situated above the roof such that the rooftop and the cover sandwich a portion of the cavity,
the cavity houses the one or more sensors,
the cavity, including the portion of the cavity sandwiched by the rooftop and the cover, houses the sensor cooling system,
the sensor cooling system includes:
an exhaust to remove hot air from the cavity, and
a manifold including a fan drawing cool air from an existing vehicle cooling system to the cavity.

16. The vehicle of claim 15, wherein
the sensor cooling system includes a hose from the manifold to the at least one of the lidar and the radar, and
the manifold and the hose are disposed in the portion of the cavity sandwiched by the rooftop and the cover.

17. The vehicle of claim 15, wherein
the exhaust includes an exhaust fan for forced removal of the hot air, and
the exhaust fan is disposed in the portion of the cavity sandwiched by the rooftop and the cover.

18. The vehicle of claim 15, wherein the existing vehicle cooling system is an auxiliary vehicle cooling system of the autonomous vehicle.

19. The vehicle of claim 15, further comprising an exhaust duct to direct the hot air to a space within the autonomous vehicle.

20. The vehicle of claim 15, wherein
the manifold includes a port releasing cool air to the cavity, and
the manifold and the port are disposed in the portion of the cavity sandwiched by the rooftop and the cover.

21. The vehicle according to claim 15, wherein
the mount is shaped so at to fit in a sunroof of the vehicle, and the mount is attached to a reinforcing vehicle chassis structure in the sunroof of the vehicle.

\* \* \* \* \*